United States Patent
Langari et al.

(10) Patent No.: US 6,261,871 B1
(45) Date of Patent: Jul. 17, 2001

(54) METHOD AND STRUCTURE FOR TEMPERATURE STABILIZATION IN FLIP CHIP TECHNOLOGY

(75) Inventors: Abdolreza Langari, Newport Beach; Seyed Hassan Hashemi, Laguna Niguel, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/493,591

(22) Filed: Jan. 31, 2000

Related U.S. Application Data

(63) Continuation-in-part of application No. 09/266,376, filed on Mar. 11, 1999.

(51) Int. Cl.$^7$ .......................... H01L 21/44; H01L 21/48; H01L 21/50
(52) U.S. Cl. .......................... 438/124; 438/124; 438/126; 438/127; 438/455; 438/456
(58) Field of Search .................................. 438/125, 126, 438/127, 456

(56) References Cited

U.S. PATENT DOCUMENTS

| | | | |
|---|---|---|---|
| 5,477,409 | * 12/1995 | Savka | 361/103 |
| 5,568,094 | * 10/1996 | Bowen et al. | 330/279 |
| 5,641,996 | * 6/1997 | Omoya et al. | 257/787 |
| 5,668,059 | * 9/1997 | Christie et al. | 438/118 |
| 5,745,857 | * 4/1998 | Maeng et al. | 455/553 |
| 5,831,831 | * 11/1998 | Freeland | 361/704 |
| 5,844,319 | * 12/1998 | Gamota et al. | 257/778 |
| 5,854,514 | * 12/1998 | Roldan et al. | 257/746 |
| 5,909,056 | * 6/1999 | Mertol | 257/704 |
| 5,945,217 | * 8/1999 | Hanrahan | 428/389 |
| 6,011,304 | * 1/2000 | Mertol | 257/706 |
| 6,054,198 | * 4/2000 | Bunyan et al. | 428/40.5 |
| 6,118,177 | * 9/2000 | Lischer et al. | 257/706 |

FOREIGN PATENT DOCUMENTS

62166072 * 7/1987 (JP) .

* cited by examiner

*Primary Examiner*—Eddie Lee
*Assistant Examiner*—Paul E Brock, II
(74) *Attorney, Agent, or Firm*—Farjami & Farjami LLP

(57) ABSTRACT

Phase Change Material ("PCM") are used to reduce the range of temperature excursions in a semiconductor die attached to an interconnect substrate in the flip chip technology. In one embodiment a PCM underfill, which comprises PCM microspheres interspersed within a polymer, is dispensed in the interface area between the semiconductor die and the interconnect substrate. Reduction of the range of temperature excursions in the semiconductor die is achieved since the PCM underfill acts as a cushion to dampen the range of temperature excursions of the semiconductor die. During dissipation of power pulses in the semiconductor die, the PCM underfill absorbs energy from the semiconductor die by changing phase from solid to liquid without a concomitant rise in the temperature of the PCM underfill. Thus, the energy released when power pulses are being dissipated in the semiconductor die does not result in a rise in the temperature of the PCM underfill. Accordingly, the temperature of the semiconductor die which is in thermal contact with the PCM underfill is not abruptly increased during power pulses. Similarly, during the time that no power pulse is being dissipated by the semiconductor die, the PCM underfill releases the stored energy by changing phase from liquid to solid while maintaining a constant temperature. Thus, the temperature of the semiconductor die which is in thermal contact with the PCM underfill is not abruptly decreased when no power pulse is being dissipated in the semiconductor die.

12 Claims, 6 Drawing Sheets

METHOD AND STRUCTURE FOR TEMPERATURE STABILIZATION IN FLIP CHIP TECHNOLOGY

This application is a continuation in part of, and claims benefit of the filing date of, and hereby incorporates fully be reference, the pending parent application entitled "Cooling System for Pulsed Power Electronics," Ser. No. 09/266,376 filed Mar. 11, 1999 and assigned to the assignee of the present application.

BACKGROUND OF THE INVENTION

1. Field of the Invention

The present invention is generally in the field of temperature stabilization for semiconductor devices. In particular the present invention is in the field of temperature stabilization in flip chip technology.

2. Background Art

As the performance, speed, and complexity of semiconductor devices increase, semiconductor devices tend to increasingly generate significant amounts of heat. Moreover, the continually shrinking packaging containing semiconductor devices has contributed to a reduction of the ability of these devices to dissipate heat through convection. The space surrounding these devices has become significantly more confined as packaging sizes shrink, thereby reducing the opportunity for convection currents to circulate and remove heat.

In addition, the increasing popularity of portable electronic devices such as cellular phones, portable televisions, palm top computers, and pagers has contributed to a demand for using smaller packages made of lighter material such as plastics which are generally lighter than metals. Plastics, relative to metals, however, generally tend to have a greater resistance to heat transfer. The opportunity for heat transfer, and the cooling of the power circuitry via conduction, is thus significantly reduced by the increasing use of non-metallic and plastic packaging materials.

Reliability of semiconductor devices is related to the temperature of the devices. Manufacturers of portable electronic systems have sought to reduce the amount of heat generated by the semiconductor devices within those systems, and to spread the heat that is generated, in order to reduce peak temperatures which would affect the reliability of the semiconductor devices within those systems. Manufacturers have made efforts to reduce or spread the heat specifically within power devices, which tend to generate a significant amount of heat.

Some manufacturers of power devices have taken the approach of adding metal heat sinks to their power devices. However, the effectiveness of the heat sinks diminishes with the air volume available for convection cooling surrounding the heat sink. Thus, the increasingly small size of portable electronic devices, as well as the size reduction of the semiconductor packaging itself, have reduced the effectiveness of heat sinks.

Another method of reducing power consumption, and therefore heat generation, is to employ a digital design. Digital communication systems are, in large part, replacing analog communication systems. This is so because digital systems, generally, can offer increased performance and lower overall power consumption than analog systems. Digital systems commonly operate in a time sharing mode or pulse mode. That is a digital system will turn on, broadcast data and then turn off. This time sharing mode allows several communications systems to share the same frequency without interfering with each other. A time sharing system can also lower overall power dissipation of a communication system, because it operates for only a fraction of the time that a continuous system operates.

The rapid cycling on and off of the output of the time sharing system can, however, give rise to significant peak power dissipation. The rapid power cycling of devices can lead to continual thermal stress as the devices are turned on, dissipate considerable power, and then are turned off. In the confined space of a personal communication device, such as a portable telephone, the temperature swings due to the rapid cycling of power can lead to significant, continuous thermal and mechanical stress on the semiconductor devices, circuit connections, wire bonds, and other mechanical connections. As stated above, portable electronic devices cannot house heat sinks to reduce the temperature swings due to the rapid cycling of power.

Thus, there is a need to reduce the thermal and mechanical stress, induced by power cycling, to increase overall reliability in digital time sharing or pulse mode communication systems and other power cycling digital systems. In other words, there is serious need in the art to reduce the magnitude of temperature excursions due to the rapid cycling of power in digital systems.

SUMMARY OF THE INVENTION

The present invention is method and structure for temperature stabilization in flip chip technology. The invention results in a reduction in the range of temperature excursions in a semiconductor die mounted on an interconnect substrate utilizing the flip chip technology. The reduction in the range of temperature excursions results in a reduction of thermal and mechanical stress during operation of the semiconductor die and thus improves the performance and reliability of the semiconductor die. In particular, the invention improves the overall reliability in digital time sharing or pulse mode communication systems and other power cycling digital systems.

The invention utilizes and incorporates a Phase Change Material ("PCM") to reduce the range of temperature excursions in a semiconductor die attached to an interconnect substrate in the flip chip technology. In one embodiment of the invention a PCM underfill, which comprises PCM microspheres interspersed within a polymer, is dispensed in the interface area between the semiconductor die and the interconnect substrate.

Reduction of the range of temperature excursions in the semiconductor die is achieved since the PCM underfill acts as a cushion to dampen the range of temperature excursions of the semiconductor die. During dissipation of power pulses in the semiconductor die, the PCM underfill absorbs energy from the semiconductor die by changing phase from solid to liquid without a concomitant rise in the temperature of the PCM underfill. Thus, the energy released when power pulses are being dissipated in the semiconductor die does not result in a rise in the temperature of the PCM underfill. Accordingly, the temperature of the semiconductor die which is in thermal contact with the PCM underfill is not abruptly increased during power pulses.

Similarly, during the time that no power pulse is being dissipated by the semiconductor die, the PCM underfill releases the stored energy by changing phase from liquid to solid while maintaining a constant temperature. Thus, the temperature of the semiconductor die which is in thermal contact with the PCM underfill is not abruptly decreased

DETAILED DESCRIPTION OF THE INVENTION

The present invention is method and structure for temperature stabilization in flip chip technology. Although the invention is described with respect to a specific embodiment, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

As stated above, the present application is a continuation in part of pending parent application entitled "Cooling System for Pulsed Power Electronics," Ser. No. 09/266,376 filed Mar. 11, 1999 and assigned to the assignee of the present application. The disclosure contained in the pending parent application is hereby incorporated fully by reference into the present continuation in part application.

Figure 1:
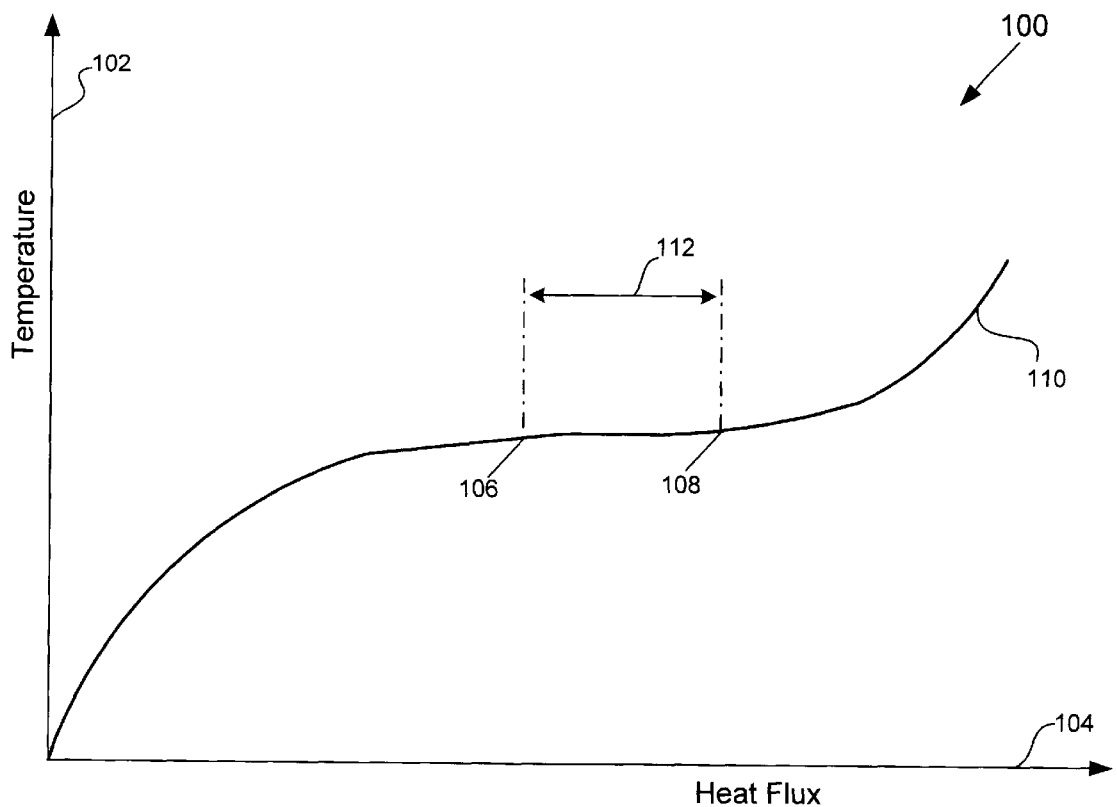
FIG. 1 shows the temperature response of a PCM material as a function of heat flux.

Phase Change Material (also referred to as "PCM" or "PCM material") are compounds whose temperature remains substantially constant during a phase change from solid to liquid and vice versa. During such a change in phase, the PCM material absorbs and releases energy while the temperature of the PCM material remains substantially unchanged. Examples of PCM materials are paraffins, eutectic salts, and hydrated salts. FIG. 1 shows the temperature change in a PCM material as a function of heat flux. It is noted that heat flux is proportional to power divided by the area over which the power is dissipated or absorbed by the PCM material. Y-axis 102 of the graph 100 in FIG. 1 corresponds to the temperature of the PCM material while x-axis 104 corresponds to the heat flux. Curve 110 shows that in response to increasing heat flux the temperature of the PCM material rises to point 106. Beginning from point 106, the phase of the PCM material begins to change from solid to liquid. A phase change in the PCM material from point 106 to point 108 takes place while the temperature of the PCM material remains substantially constant. As shown in graph 100, in the region between points 106 and 108, which is pointed to generally by numeral 112, the temperature of the PCM material remains substantially constant.

Figure 2:
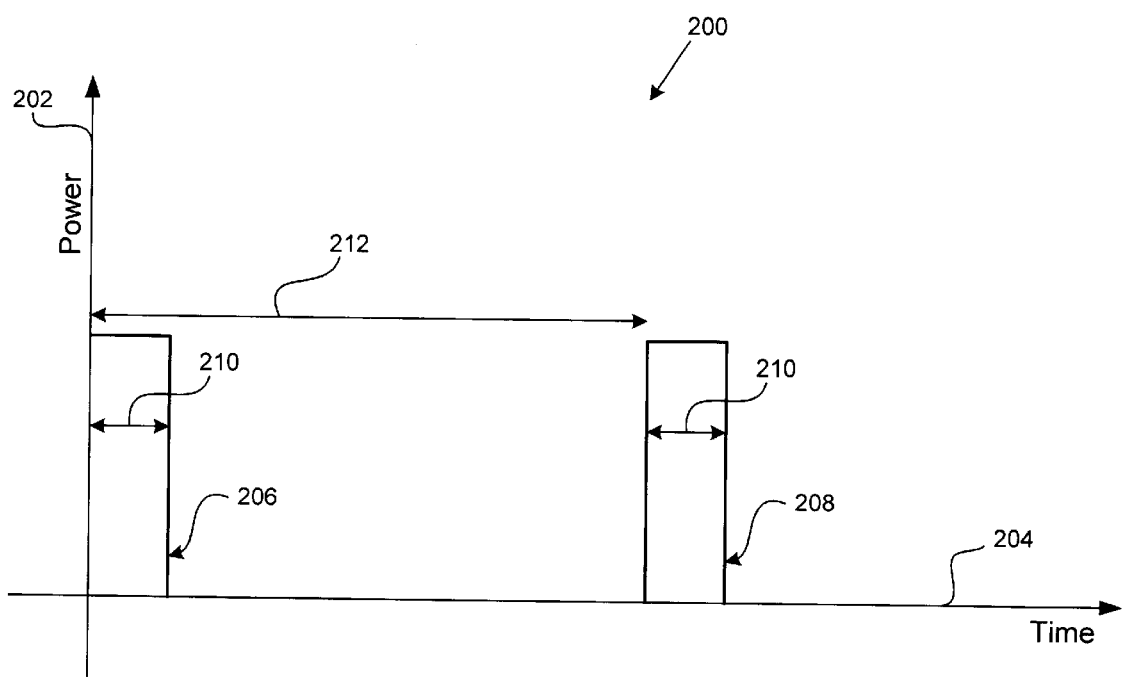
FIG. 2 is a graph of power dissipation versus time for an example pulse power system.

FIG. 2 is a graph of power dissipation versus time for an example pulse power system as may be found, for example, in a Time Division Multiple Access (TDMA) portable phone. FIG. 2 is used merely for example purposes to illustrate the present invention. However, it is manifest that the present invention is by no means limited to pulse power or TDMA systems. As discussed below, the invention can be applied to reduce the range of temperature excursions or to eliminate temperature excursions altogether in any semiconductor device.

In graph 200 of FIG. 2, y-axis 202 corresponds to dissipated power and x-axis 204 corresponds to time. FIG. 2 illustrates the timing of successive power pulses 206 and 208. In the example shown in FIG. 2, width 210 of pulses 206 and 208 is approximately 525 microseconds. Period 212 which is measured from the rising edge of pulse 206 to the rising edge of pulse 208 is approximately 4200 microseconds. Thus, pulses 206 and 208 are separated by approximately 3675 microseconds. In the example of graph 200 shown in FIG. 2, the duty cycle of power pulses 206 and 208 is 12.5%. By way of example, if a Gallium Arsenide ("GaAs") power amplifier is used in a TDMA system, each power pulse shown in FIG. 2 would have a power peak of approximately 3.0 watts.

The time values shown in FIG. 2 are typical for some Time Division Multiple Access (TDMA) phones, for example those following the GSM (Global System for Mobile communication) standard. Communications systems, such as TDMA phones, which operate by broadcasting information in a pulse mode are commonplace. In addition many electronic devices, such as CDMA phones, PCS phones, portable phones, pulse lasers, power supplies, radar, television, and many other devices within and outside of the communication arts operate, at least partially, in a pulsed format, and may therefore have a power dissipation behavior that looks similar to the pulsed power dissipation illustrated in graph 200 of FIG. 2.

The temperature of a semiconductor device is a function of the power dissipation in the device. Thus, a semiconductor device manifests temperature excursions with a period determined by the period of the power pulses, that period being 4200 microseconds in the example of FIG. 2. Moreover, the range of such temperature excursions (i.e. the amplitude of the temperature excursions) is directly proportional to the peak power dissipation during the power pulses.

Figure 3A:
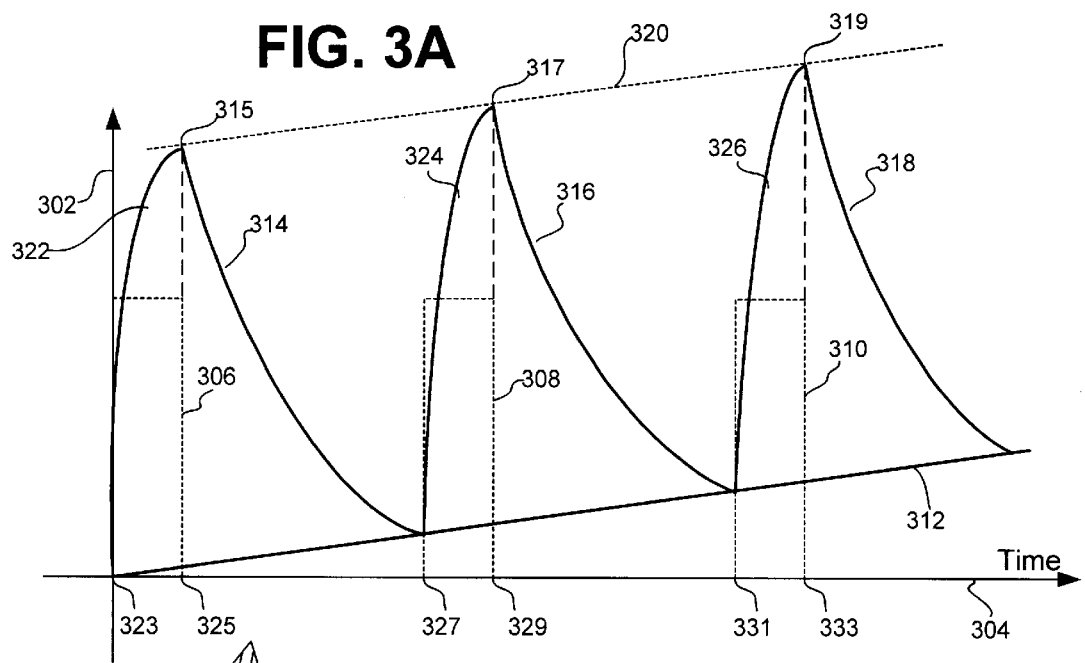
FIG. 3A illustrates the initial transient temperature response of an exemplary GaAs power amplifier to a series of power pulses.
Figure 3B:
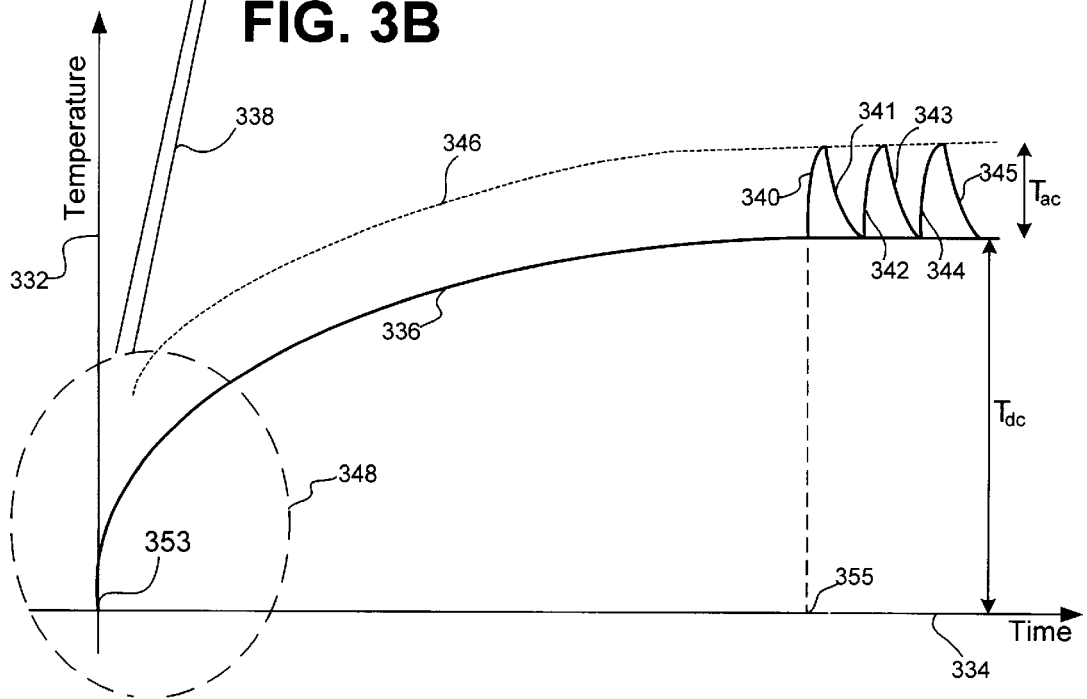
FIG. 3B illustrates both the steady state temperature response as well as the initial transient temperature response of an exemplary GaAs power amplifier to a series of powerpulses.

FIGS. 3A and 3B illustrate the temperature response of a semiconductor device, such as a GaAs power amplifier operating in a pulse mode, which dissipates power according to graph 200 of FIG. 2. Referring to FIG. 3A, the initial transient temperature response of the GaAs power amplifier (which is used as an example to illustrate the present invention) is shown. Three power pulses 306, 308, and 310 are shown in dotted lines. Each of these three power pulses is analogous to power pulse 206 or 208 in FIG. 2. Curves 312, 322, 314, 324, 316, 326, and 318 in FIG. 3A show the temperature response of the exemplary GaAs power amplifier in response to power pulses 306, 308, and 310. X-axis 304 corresponds to time. Y-axis 302 corresponds to power when discussing power pulses 306, 308, and 310. When discussing temperature curves 312, 322, 314, 324, 316, 326, and 318, y-axis 302 corresponds to temperature. Temperature curves 312, 322, 314, 324, 316, 326, 318 and power pulses 306, 308, and 310 are superimposed and shown in the same graph solely for ease of understanding their temporal relationship along the x-axis. Thus, no unitary vertical scale is intended by the y-axis and FIG. 3A is for the purpose of illustrating the temporal behavior of the temperature curves relative to the temporal behavior of power pulses.

Curve 322 shows that the temperature of the GaAs power amplifier begins to increase from time 323 to time 325. The time period between time 323 to time 325 corresponds to the duration of power pulse 306. As shown in FIG. 3A, peak temperature 315 in temperature curve 322 is reached at time 325. From time 325 to time 327 no power is being dissipated in the GaAs power amplifier since the power pulse terminated at time 325. Temperature curve 314 shows the gradual decrease in the temperature of the GaAs power amplifier from time 325 to time 327 when no power is being dissipated in the power amplifier. However, prior to the temperature of the GaAs power amplifier falling completely back to its original level (i.e. its level at time 323), another power pulse, i.e. power pulse 308 is initiated. The temperature of the power amplifier begins to increase from time 327 to time 329 in response to power pulse 308.

Temperature curve 324 shows that the temperature of the GaAs power amplifier begins to increase from time 327 to time 329. The time period between time 327 to time 329 corresponds to the duration of power pulse 308. As shown in FIG. 3A, peak temperature 317 in temperature curve 324 is reached at time 329. From time 329 to time 331 no power is being dissipated in the GaAs power amplifier since the power pulse terminated at time 329. Temperature curve 316 shows the gradual decrease in the temperature of the GaAs power amplifier from time 329 to time 331 when no power is being dissipated in the power amplifier. However, prior to the temperature of the GaAs power amplifier falling completely back to its previous level (i.e. its level at time 327), another power pulse, i.e. power pulse 310 is initiated. The temperature of the power amplifier begins to increase from time 331 to time 333 in response to power pulse 310.

Temperature curve 326 shows that the temperature of the exemplary GaAs power amplifier begins to increase from time 331 to time 333. The time period between time 331 to time 333 corresponds to the duration of power pulse 310. As shown in FIG. 3A, peak temperature 319 in temperature curve 326 is reached at time 333. Temperature curve 318 shows the gradual decrease in the temperature of the GaAs power amplifier after time 333 until another power pulse is initiated in the power amplifier.

Baseline temperature curve 312 shows that the temperature of the semiconductor device (i.e. the GaAs power amplifier in this example), continues to increase due to the continuing stream of power pulses that are initiated and dissipated and because the semiconductor device does not completely cool off between two adjacent power pulses.

Thus in the initial transient portion of the operation of the semiconductor device shown in FIG. 3A, the baseline temperature of the device continues to increase as shown by curve 312. Along with the gradual rise in the baseline temperature of the device, there are temperature excursions 322, 314, 324, 316, 326, and 318. The upper boundary of the temperature excursions is shown by dotted curve 320. Thus, solid curve 312 and dotted curve 320 constitute an envelope within which temperature excursions 322, 314, 324, 316, 326, and 318 occur.

As stated above, FIG. 3A illustrated the initial transient temperature response of a semiconductor device and the timing relation of the initial transient temperature response to a series of power pulses 306, 308, and 310. FIG. 3B covers a longer period of time which includes the initial transient temperature response of the semiconductor device, as well as the steady state temperature response of the device, to a large number of power pulses. The initial transient response of the semiconductor device (i.e. the GaAs power amplifier in the present example) comprises those portions of solid curve 336 and dotted curve 346 that are enclosed in circle 348 in FIG. 3B. An expanded view of the initial transient response enclosed by circle 348 was already illustrated in FIG. 2A. Arrow 338 in FIG. 3B points to FIG. 2A to indicate that an expanded view of the initial transient response to the initial series of power pulses is shown in FIG. 2A.

As shown in FIG. 3B, y-axis 332 corresponds to temperature while x-axis 334 corresponds to time. Solid curve 336 represents the baseline temperature of the semiconductor device as its temperature gradually rises from time 353 until time 355 when the temperature of the device reaches its steady state condition. A typical amount of time necessary to reach the steady state condition for a GaAs power amplifier is approximately three to five minutes. Thus, time 355 is approximately three to five minutes after the initial device turn-on at time 353. During steady state condition which prevails after time 355, the baseline temperature of the device is substantially constant as shown by curve 336 in FIG. 3B. This constant steady state temperature is referred to as $T_{dc}$ as shown in FIG. 3B.

As illustrated in FIGS. 3A and 3B, in response to the series of power pulses dissipated in the semiconductor device, a series of temperature excursions occur. Thus, absent the method and structure of the present invention, temperature excursions occur all along the operation of the semiconductor device in response to power pulses. Referring to FIG. 3B, beginning from time 353 to time 355 and thereafter, temperature excursions occur in response to each power pulse. The initial transient temperature excursions were shown in FIG. 3A. The steady state temperature excursions are shown as temperature excursions 340, 341, 342, 343, 344, and 345 in FIG. 3B.

The upper limit of the temperature excursions during both the initial transient condition and the steady state condition is indicated by dotted curve 346. Absent the present invention, the range of temperature excursions during the operation of the semiconductor device remains relatively large and constant. The range of temperature excursions during the operation of the semiconductor device is referred to by $T_{ac}$ and is shown in FIG. 3B. Thus, the envelope defined by solid curve 336 and dotted curve 346 defines the range of the temperature excursions (i.e. the value of the $T_{ac}$) during the operation of the exemplary GaAs power amplifier. As stated above, the present invention reduces or altogether eliminates (i.e. sets to zero) the range of temperature excursions $T_{ac}$ and thus stabilizes the temperature of the semiconductor device despite the continued occurrence of power pulses.

Figure 4A:
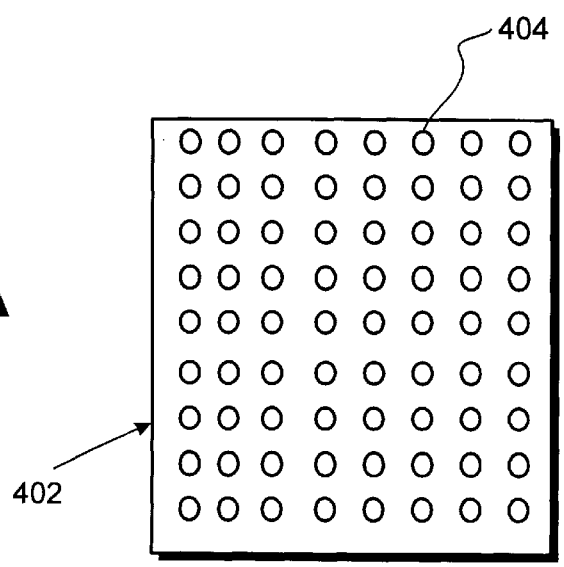
FIG. 4A shows an exemplary GaAs die to be mounted on an interconnect substrate utilizing the flip chip technology.

According to the invention's method and structure, an underfill comprising PCM microspheres (also referred to as the "PCM underfill" in this application) is utilized in flip chip technology to minimize or eliminate temperature excursions during the operation of a semiconductor device such as a GaAs power amplifier. Referring to FIG. 4A, a GaAs die 402 to be mounted on an interconnect substrate utilizing the flip chip technology is shown (the interconnect substrate is not shown in FIG. 4A). As is known in the art, flip chip technology is a surface mount technology wherein the die is "flipped" over so that the active surface of the die faces the interconnect substrate. Since the active surface of the die faces the interconnect substrate, it is possible for the die to make electrical contact with the interconnect substrate directly and without use of bond wires.

In flip chip technology, the electrical contact between the die and the interconnect substrate is achieved through an area array comprised of "solder bumps" that are planted on the active surface of the die. "Flip chip" technology refers, among other things, to the process and structure associated with "flipping" the semiconductor die to bring the solder bumps on the active surface of the semiconductor die in direct contact with the interconnect substrate. It is noted that the interconnect substrate in turn makes electrical connection with various external chips through an array of "solder balls."

Referring again to FIG. 4A, solder bumps 404 are arranged in an area array. Each solder bump is planted on the active surface of GaAs die 402. Each solder bump is connected to a respective circuit on the active surface of GaAs die 402 through a via, an under bump metallurgy ("UBM") and a bonding pad. The via, UBM, and bonding pad are not shown in any of the Figures. Typically, each solder bump is about 100 to 125 microns in diameter.

Figure 4B:
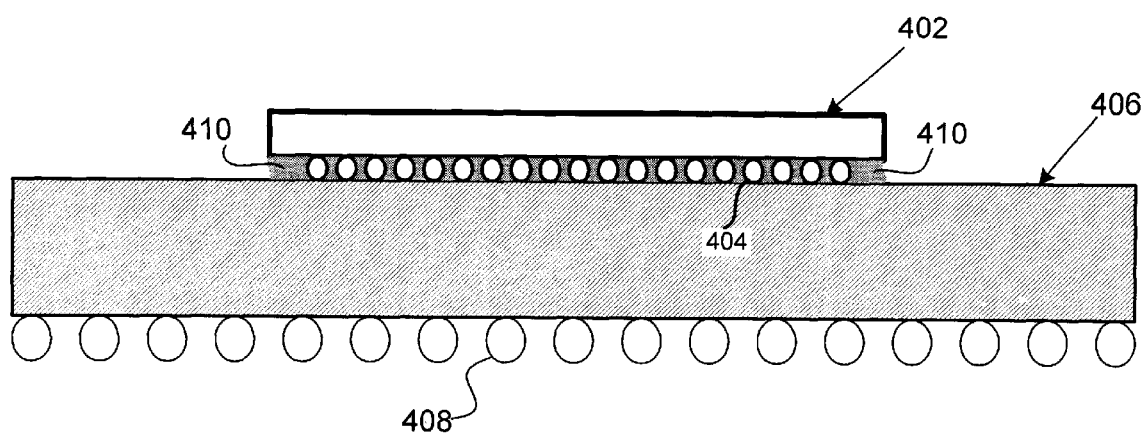
FIG. 4B shows a cross-section view of an exemplary GaAs die mounted on an interconnect substrate utilizing the flip chip technology and a PCM underfill distributed in the interface area between the GaAs die and the interconnect substrate.

Referring to FIG. 4B, a cross-section view of GaAs die 402 mounted on interconnect substrate 406 utilizing the flip chip technology is shown. Solder bumps 404 are shown in contact with interconnect substrate 406. Solder balls 408 are planted on the bottom of interconnect substrate 406 to enable the interconnect substrate to make contact with other devices. Solder balls 408 are typically about 650 to 800 microns in diameter and are thus large than solder bumps 404. Underfill 410 is dispensed in the interface area between the active surface of semiconductor die 402 and interconnect substrate 406. An expanded view of underfill 410 is shown as underfill 510 in FIG. 5A.

Figure 5A:
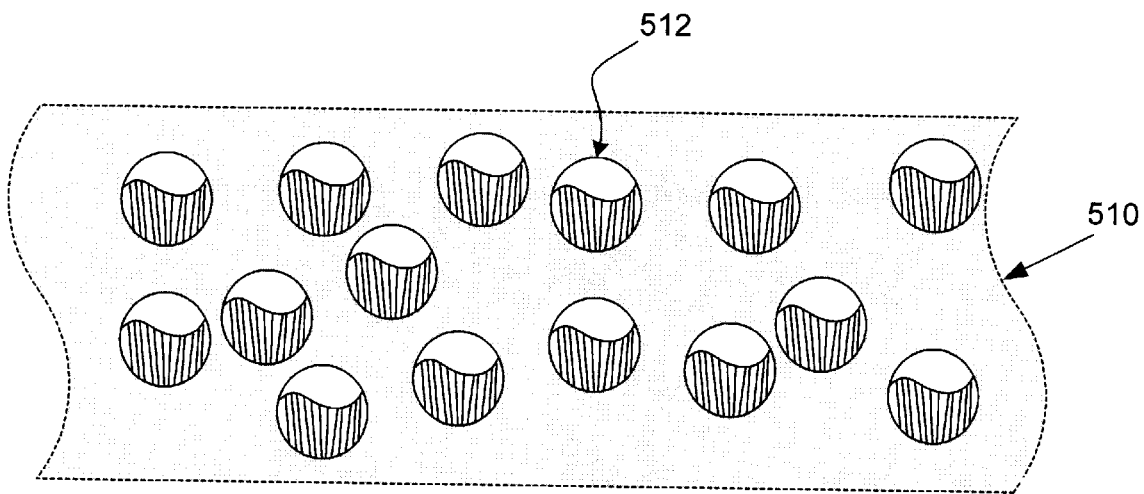
FIG. 5A illustrates a PCM underfill within which PCM microspheres are interspersed.
Figure 5B:
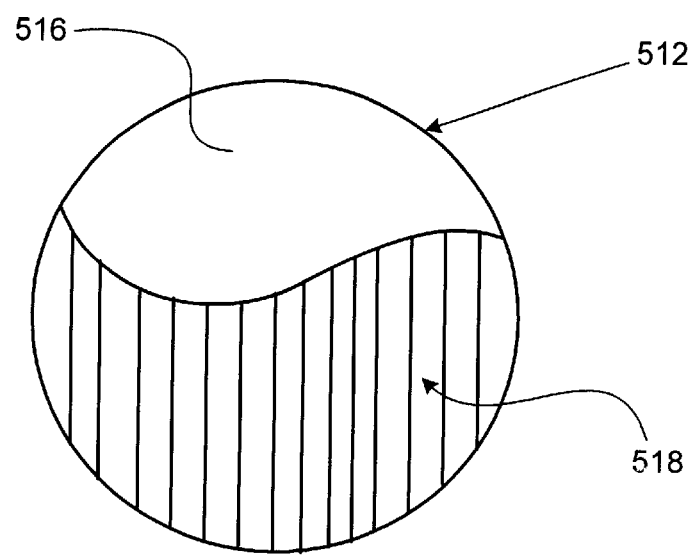
FIG. 5B shows an expanded view of one of the PCM microspheres in the PCM underfill of FIG. 5A.

FIG. 5A illustrates underfill 5 10 within which are "PCM microspheres" 512. Underfill 510 typically consists of a polymer used in packaging semiconductor devices. As shown in FIG. 5A, a large number of PCM microspheres 512 are interspersed throughout underfill 510. An expanded view of each PCM microsphere 512 is shown in FIG. 5B. PCM microsphere 512 comprises PCM material 518 shown as the vertically hatched area and "empty" portion 516 which is typically comprised of air. Examples of PCM material 518 used in PCM microsphere 512 are paraffins, eutectic salts, and hydrated salts. "Empty" portion 516 of PCM microsphere 512 is not filled with PCM material 518 so that the PCM material would have room to expand when its temperature increases.

Figure 6:
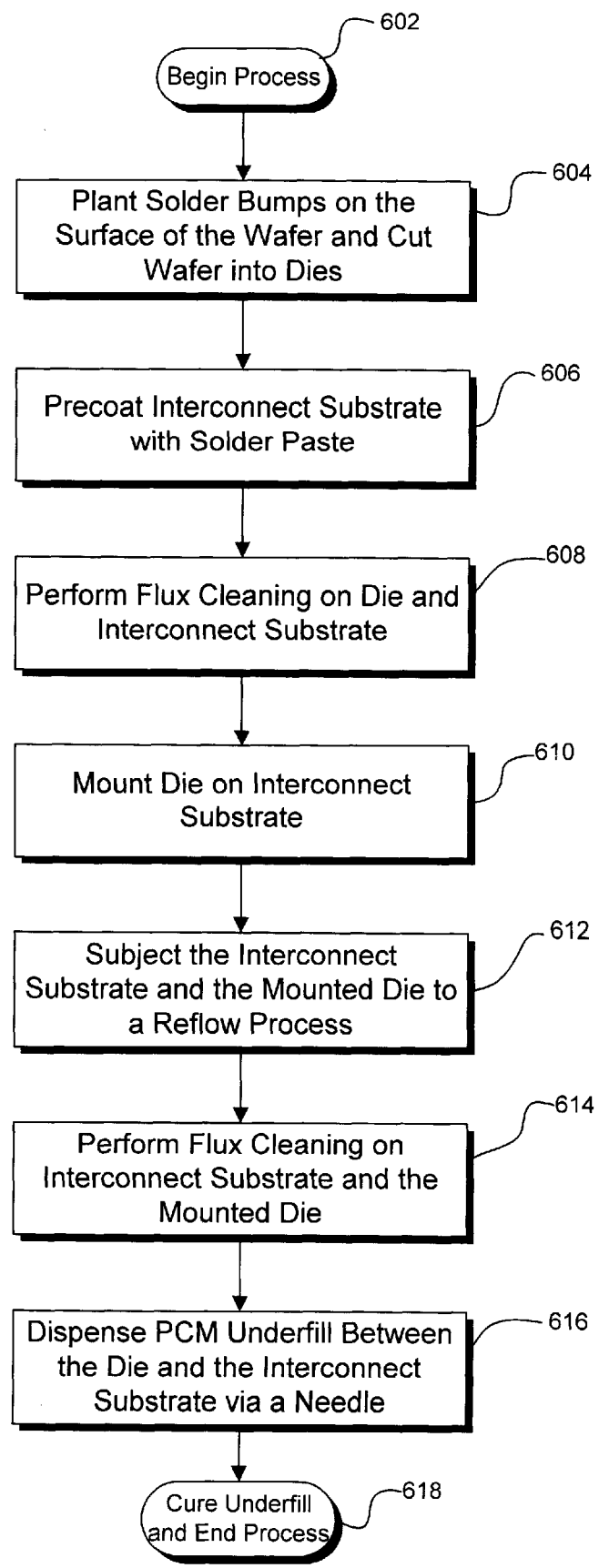
FIG. 6 illustrates an example of a process by which PCM underfill is introduced in the interface area between a semiconductor die and an interconnect substrate.

Referring to FIG. 6, an example of a process by which PCM underfill 410 (FIG. 4) is introduced in the interface area between semiconductor die 402 and interconnect substrate 406 is now discussed. At step 602 the process begins. At step 604 solder bumps are planted on the surface of the semiconductor wafer. Typically, a solder bump makes contact with an active circuit, such as the emitter of a GaAs transistor, through a via, an under bump metallurgy ("UBM"), and a bonding pad. During step 604 the wafer is cut into individual dies. At step 606, the interconnect substrates are precoated with solder paste. At step 608, the semiconductor dies and the interconnect substrates are taken through a cleaning process such as flux cleaning. During flux cleaning a spray of high pressure liquid is used to clean the surface of the dies and the interconnect substrate. The purpose of the cleaning process is to reduce or eliminate contamination and also to create a stronger adhesion between the solder bumps and the solder paste precoated on the interconnect substrate.

At step 610, the solder bumped die is mounted on the interconnect substrate. At step 612, the solder bumped die mounted on the interconnect substrate is taken through a "reflow process" in a "reflow oven." During the reflow process the solder bumps on the die and the precoated solder paste on the interconnect substrate are melted and form strong adhesion and strong electrical contact to each other. At step 614, the semiconductor die mounted on the interconnect substrate is subjected to another flux cleaning process during which the interface between the die and the interconnect substrate is cleaned to reduce or eliminate contamination and in preparation for the step of dispensing the underfill.

At step 616, a PCM underfill, such as underfill 510 shown in FIG. 5, is dispensed in the interface area between the semiconductor die and the interconnect substrate. In one embodiment of the invention, the PCM underfill is dispensed by means of a needle. The interface area between the semiconductor die and the interconnect substrate is of course partially occupied by the solder bumps of the semiconductor die. The dispensed PCM underfill is distributed throughout the interface area between the semiconductor die and the interconnect substrate by a capillary action. Capillary action refers to a process by which the force of adhesion between a solid surface (e.g. the solid surface of the semiconductor die or the interconnect substrate) and a liquid causes the liquid to be raised or moved against the solid surface.

At step 618, after the dispensed PCM underfill is permitted sufficient time to cover the entire interface area between the semiconductor die and the interconnect substrate, the unit comprised of the die mounted on the interconnect substrate and the PCM underfill therebetween are cured to finalize the process. The process described by reference to FIG. 6 is only one method of applying a PCM underfill in flip chip technology. It is manifest that other methods are possible without departing from the scope of the present invention.

The present application discloses, among other things, a structure and method utilizing and incorporating a PCM underfill in flip chip technology. Use of PCM underfill results in a reduction of temperature excursions in the semiconductor die and stabilizes the temperature of the die. Reference is made again to FIG. 3B and the specific example of a GaAs power amplifier operating in a pulse mode. Absent the structure and method of the present invention, even during the steady state operation of the GaAs power amplifier there are always temperature excursions as shown by temperature excursions 340, 341, 342, 343, 344, and 345. As shown in FIG. 3B, these temperature excursions occur even after the steady state is reached at time 355.

The range of the temperature excursions is indicated by solid baseline curve 336 and the dotted upper limit curve 346. As seen in FIG. 3B, the range of the temperature excursions remains substantially unchanged during both the initial transient stage of the operation of the GaAs power amplifier prior to time 355 and the steady state condition after time 355. The range of the temperature excursions in FIG. 3B is indicated by $T_{ac}$. Use of PCM underfill in flip chip technology as disclosed in the present application results in a dramatic reduction in the range of temperature excursions $T_{ac}$. Although, the steady state temperature shown as $T_{dc}$ in FIG. 3B remains substantially unaffected with or without the method and structure of the present invention, the invention results in a substantial reduction of the range of temperature excursions $T_{ac}$ during the operation of the semiconductor device, both before and after steady state condition is reached.

Reduction of the range of temperature excursions $T_{ac}$ is achieved since PCM underfill 510 (FIG. 5), and more particularly PCM microspheres 512, act as cushions to dampen the range of temperature excursions of the semiconductor die. In the example given in the present application, during dissipation of power pulses in the semiconductor die, the PCM microspheres absorb energy from the GaAs power amplifier by changing phase from solid to liquid without a concomitant rise in the temperature of the PCM material. Thus, the energy released when power pulses are being dissipated in the semiconductor die does not result in a rise in the temperature of the PCM material. Accordingly, the temperature of the semiconductor die which is in thermal contact with the PCM underfill is not abruptly increased during power pulses.

Similarly, during the time that no power pulse is being dissipated by the GaAs amplifier, the PCM material releases the stored energy by changing phase from liquid to solid while maintaining a constant temperature. Thus, the temperature of the semiconductor die which is in thermal contact with the PCM underfill is not abruptly decreased when no power pulse is being dissipated in the semiconductor die. In this manner the range of temperature excursions $T_{ac}$ is dramatically reduced by the present invention.

The reduction of the range of temperature excursions $T_{ac}$ in a semiconductor die mounted on an interconnect substrate utilizing the flip chip technology results in a reduction of thermal and mechanical stress during operation of the semiconductor die and thus improves the performance and reliability of the semiconductor die. In particular, the invention improves the overall reliability in digital time sharing or pulse mode communication systems and other power cycling digital systems.

Throughout the present application, various examples for typical PCM materials that can be used in the present invention or various examples of semiconductor devices or systems that can make use of the present invention have been provided. It is understood that various types of PCM materials can be used in the present invention. Also, various types of semiconductor devices or systems can utilize the present invention without departing from the scope thereof. Further, throughout the present invention reference has been made to a GaAs power amplifier or a GaAs die to explain the invention by way of an example. It is appreciated by those skilled in the art that any semiconductor circuit and semiconductor die can make use of the invention. Most notably the invention is quite applicable to stabilizing the temperature of a silicon die attached to an interconnect substrate utilizing flip chip technology.

Thus, a method and structure for temperature stabilization in flip chip technology has been described.

What is claimed is:

1. A method comprising the steps of:
    planting a plurality of solder bumps on a first surface of a semiconductor die;
    dispensing a layer of PCM underfill between said first surface of said semiconductor die and an interconnect substrate, said layer of PCM underfill absorbing and releasing heat from said semiconductor die so as to reduce a range of temperature excursions occurring in said semiconductor die.

2. The method of claim 1 wherein said semiconductor die comprises a GaAs power amplifier operating in a pulse mode.

3. The method of claim 1 wherein said PCM underfill comprises a plurality of PCM microspheres interspersed within a polymer.

4. The method of claim 3 wherein each of said plurality of PCM microspheres comprises a PCM selected from the group consisting of paraffins, eutectic salts, and hydrated salts.

5. The method of claim 1 wherein said planting step comprises planting said plurality of solder bumps in an area array on said first surface of said semiconductor die.

6. The method of claim 1 wherein said semiconductor die is a silicon die.

7. The method of claim 1 wherein said first surface of said semiconductor die is an active surface of said semiconductor die.

8. A method comprising the steps of:
    planting a plurality of solder bumps on an active surface of a semiconductor die;
    mounting said semiconductor die on an interconnect substrate such that said plurality of solder bumps contact said interconnect substrate;
    dispensing a PCM underfill into an interface area between said semiconductor die and said interconnect substrate, said PCM underfill absorbing and releasing heat from said semiconductor die so as to reduce a range of temperature excursions occurring in said semiconductor die.

9. The method of claim 8 wherein said dispensing step comprises distributing said PCM underfill into said interface area by a capillary action.

10. The method of claim 8 wherein said dispensing step comprises dispensing said PCM underfill via a needle into said interface area.

11. The method of claim 10 wherein said PCM underfill is distributed throughout said interface area by a capillary action.

12. The method of claim 8 further comprising a step of reflowing said plurality of solder bumps, wherein said step of reflowing occurs after said mounting step but prior to said dispensing step.

* * * * *